United States Patent [19]

Neale

[11] 4,199,692
[45] Apr. 22, 1980

[54] AMORPHOUS NON-VOLATILE RAM

[75] Inventor: Ronald G. Neale, Indian Harbour Beach, Fla.

[73] Assignee: Harris Corporation, Melbourne, Fla.

[21] Appl. No.: 906,381

[22] Filed: May 16, 1978

[51] Int. Cl.² .................................. H01L 27/24
[52] U.S. Cl. ........................... 307/238; 357/2; 365/163
[58] Field of Search .................. 357/2; 307/238; 365/163

[56] References Cited

U.S. PATENT DOCUMENTS

| | | | |
|---|---|---|---|
| 3,336,514 | 8/1967 | Hiatt et al. | 357/2 |
| 3,418,619 | 12/1968 | Lighty | 357/2 |
| 3,448,302 | 6/1969 | Shanefield | 357/2 |
| 3,530,441 | 9/1970 | Ovshimsky | 307/238 |
| 3,685,028 | 8/1972 | Wakabayashi | 357/2 |
| 3,846,767 | 11/1974 | Cohen | 357/2 |

OTHER PUBLICATIONS

Matick et al., IBM Tech. Discl. Bulletin, vol. 16, No. 6, Nov. 1973, p. 1806.
Gambino et al., IBM Tech. Discl., Bulletin, vol. 14, No. 1, Jun. 1971, pp. 139-140.

*Primary Examiner*—William D. Larkins
*Attorney, Agent, or Firm*—Leitner, Palan, Martin & Bernstein

[57] ABSTRACT

An amorphous memory cell operated to have a first logic state represented by a high resistance state, substantially no crystal structure and a first threshold level and a second logic state represented by a high resistance state, microcrystal structure and a threshold level lower than the first threshold level. The logic state is read by monitoring the electrical characteristic of the cell for a constant voltage read pulse at a time greater than the threshold switching delay duration for the first logic state and less than the threshold switching delay duration for the second logic state at the read pulse voltage.

13 Claims, 17 Drawing Figures

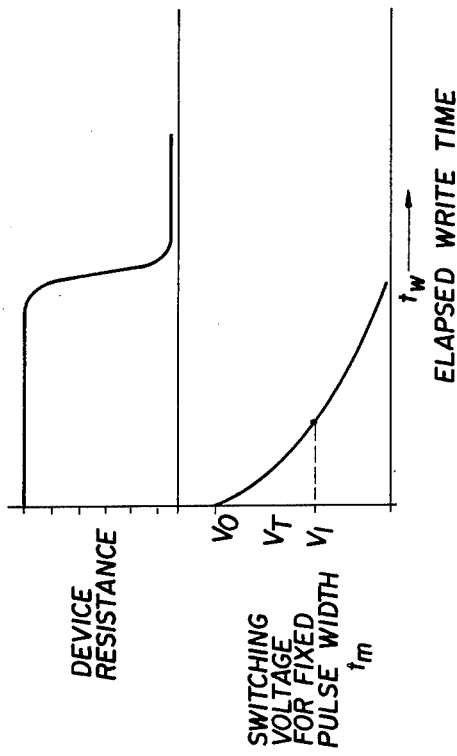
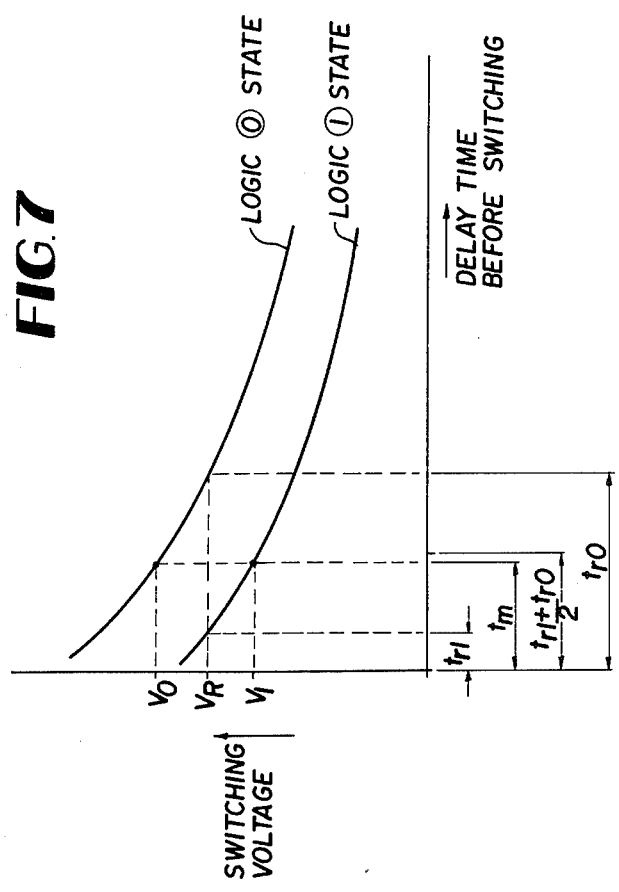
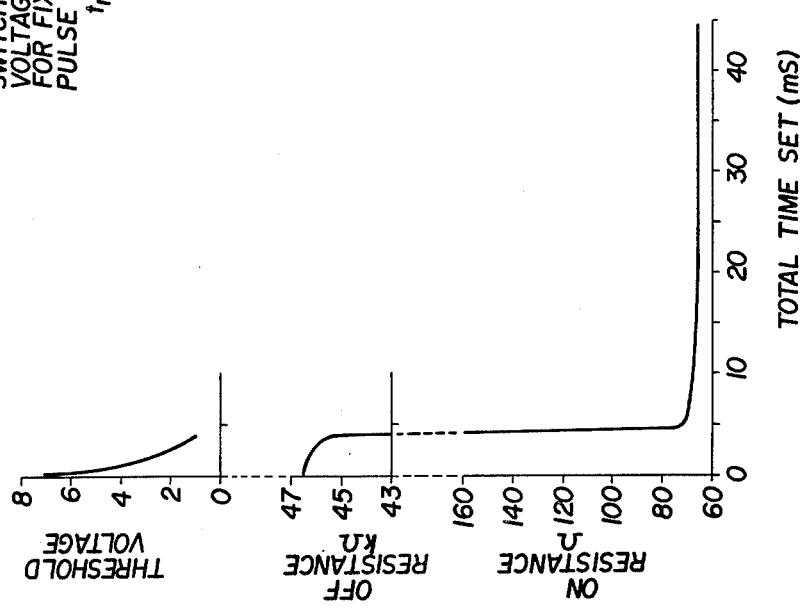

(a) START WRITE — HOT FILAMENT
(b) END WRITE
(c) LOGIC ① STATE (a) ERASE — EXPANDED HOT FILAMENT
(b) LOGIC ⓪ STATE

AMORPHOUS NON-VOLATILE RAM

BACKGROUND OF THE INVENTION

The present invention relates generally to memory cells and more specifically to the use of amorphous devices as non-volatile fast read and write random access memories. The use of amorphous semiconductor devices as memory cells is well known. The time generally required to establish the low resistance state of an amorphous memory is in the order of a few milliseconds. Thus, amorphous memory cells have generally been slow write and are considered to be electrically alterable read only memories (EAROM).

The mechanism of writing in an amorphous layer is the growth of crystal around the hot conducting constant voltage filament that conducts the write current. The hot channel is eventually suppressed by current stealing of the growing crystallites. The appearance of the low resistance state is discontinuous in time and this can be accounted for by a combination of the unique discontinuous electrical conductivity characteristics of conductor-dielectric mixtures and the fact that the micro crystallites are growing in glass at elevated temperatures.

The continuous switching of amorphous devices between the high and low resistance states produces an amorphous structure of varying "offness" and "onness". These degrees of "onness" and "offness" have been recognized by U.S. Pat. No. 3,418,619 to P. E. Lighty and U.S. Pat. No. 3,448,302 to D. J. Shanefield. The operation of the device, depending on the degree of "onness" or "offness," are discussed in these patents and are considered an undesirable effect. The Lighty patent suggests using a small diameter elongated filament structure as a solution of the problem. Shanefield's approach to the problem is to use an adaptive system which monitors the degree of "offness" or "onness" and modifies the current or voltage to achieve the desired results. Shanefield measures the degree of "offness" by measuring the threshold level breakdown voltage of the device. Once a critical threshold value has been passed, corrective measures are taken to increase the "onness" of the device. Thus, Lighty and Shanefield, realizing the variance of threshold value with the degree of "onness", operate to correct this state such that the amorphous memory may be operated between the two desired states, namely a high resistance state and a low resistance state. The operation of these two devices are considered to be slow as functioning in the millisecond range for writing.

The relationship of the threshold voltage levels and the resistance is illustrated in FIG. 1. As can be seen, the appearance and growth of crystallites during the early stage of the write are not easily detectable by changes in the device conductance or resistance, but they do shorten the dielectric path between the electrodes and reduce the switching or threshold voltage. Therefore, from the moment that the crystal growth starts, the threshold voltage is decreasing. This phenomenon is described in "The Switching Mechanisms in Amorphous Chalcogenide Memory Devices," A. G. Steventon, Journal of Non-Crystalline Solids, 21 (1976) 312-329, (North Holland Publishing Co.).

SUMMARY OF THE INVENTION

The present invention takes advantage of the decrease in threshold at the high resistance state and uses it to its advantage in creating a fast read and write amorphous semiconductor memory cell. A first logic state of the memory is represented by a high resistance state of the first threshold level and a second logic state is represented by a high resistance state and a second threshold level lower than the first threshold level. In either logic state, the amorphous device has substantially no crystal structure or a microcrystal structure insufficient to create the high conductivity state. A fast write non-volatile RAM is produced with a write time of under one microsecond.

The logic state of the amorphous memory cell is read by monitoring the electrical characteristics; namely, current through or voltage across the cell for a constant read pulse. The read pulse has a duration greater than the duration required for conduction by switching of said second logic state at said read voltage amplitude and is of duration less than necessary to ensure conduction by switching first logic state at said read voltage. The monitoring occurs in the time period after the duration for conduction of said second logic state at the read voltage.

The device is made of a sufficiently small cross-sectional area such that the second logic state may be erased by applying a pulse of a greater current amplitude than the write pulse sufficient to cause the hot conducting channel to expand to the extremities of the device aperture.

OBJECTS OF THE INVENTION

An object of the present invention is to provide amorphous memory cells having two logic states capable of being written in a matter of microseconds.

Another object of the invention is to provide an amorphous memory cell which takes advantage of the change of threshold voltage in the high resistance state.

A further object of the invention is to provide a reading technique capable of determining the logic state of an amorphous memory cell having high resistance states.

Still another object of the invention is to provide an amorphous memory cell capable of fast reading, writing and erasing.

Other objects, advantages, and novel features of the present invention will become apparent from the following detailed description of the invention when considered in conjunction with the accompanying drawings.

BRIEF DESCRIPTION OF THE DRAWINGS

FIG. 1 is a graph of the relationship at room temperature of the resistance and threshold voltage of an amorphous memory device during a write sequence.

FIG. 6 is a graph of the resistance and voltage of an amorphous device for a fixed width pulse.

FIG. 7 is a graph of a switching voltage for the logic zero and the logic one state as a function of time.

DESCRIPTION OF THE PREFERRED EMBODIMENT

Figure 2:
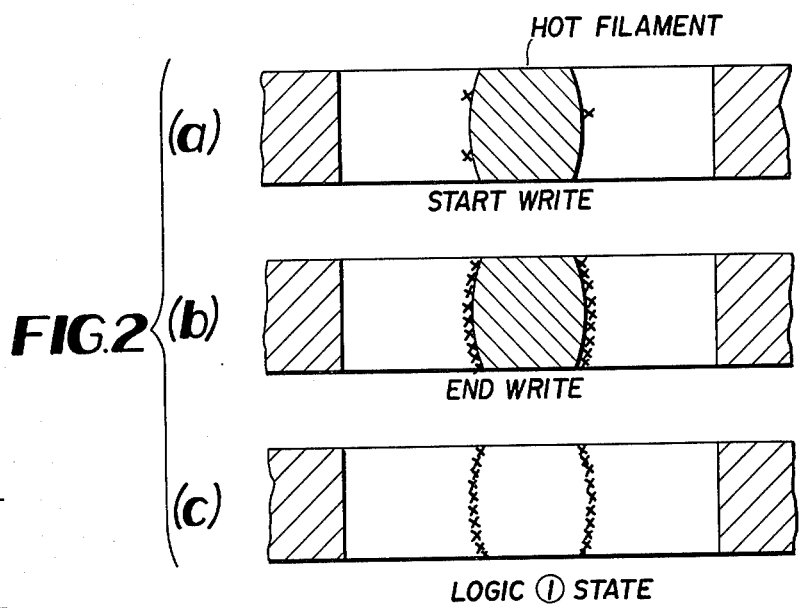
FIG. 2a is a cross-section of an amorphous semiconductor device at the beginning of a write cycle.
FIG. 2b is a cross-section of a semiconductor amorphous device at the end of a write cycle according to the present invention.
FIG. 2c is a cross-section of an amorphous semiconductor device at the logic one state according to the present invention.
Figure 3:
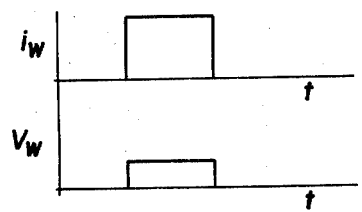
FIG. 3 is a graph of the current and the voltage of the write pulse.

As illustrated in FIG. 1, the resistance of an amorphous semiconductor device changes very little in a high resistance state while the threshold voltage change is considerable. For almost no detectable change in resistance above 40 k ohms, the threshold varies as much as three volts. The present invention takes advantage of this change of threshold voltage in the high resistance state to produce a fast write RAM. The first logic state of the present device may be defined at a relatively high threshold voltage of greater than five volts with the second logic state having a lower threshold voltage, for example, four volts. The decrease in threshold level is produced by microcrystal structures in the amorphous layer which are not sufficient to cause the resistance of the device to substantially change. An application of a write pulse as illustrated in FIG. 3 for a duration of under one microsecond is sufficient to produce a change from the first logic state to the second logic state. The write sequence is illustrated in FIG. 2 where, for example, the write pulse of FIG. 3 is applied and hot filament appears in the amorphous material. The hot channel is reduced by current stealing of the write current by the growing of crystallites and upon the termination of the write pulse as illustrated in FIG. 2b, microcrystallite structures are formed as illustrated in FIG. 2c to produce the reduced threshold level device. This is defined as the second logic state.

Although a description of two logic states operating at the upper end of the threshold value; for example, from five and one-half to four volts, the device may be also operated anywhere along the threshold level range as long as the resistance of the amorphous semiconductor device remains in the high range. Thus, the device may be switched between four and two volts or even three to one volts.

Figure 4:
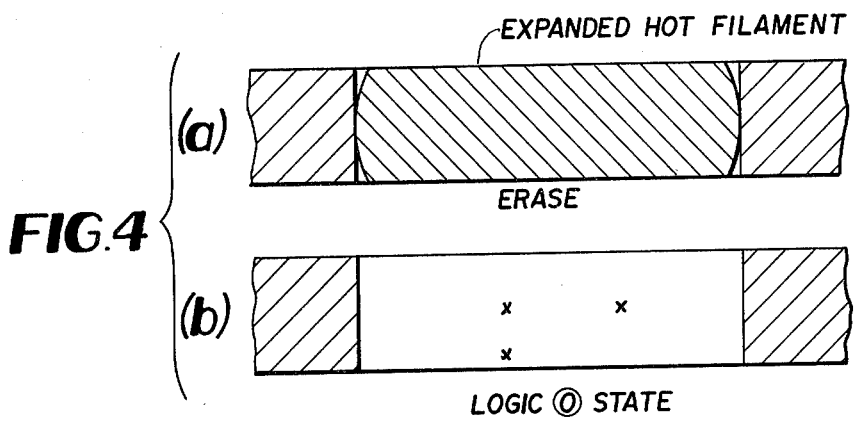
FIG. 4a is a cross-section of a semiconductor device during an erase sequence according to the present invention.
FIG. 4b is a cross-section of a semiconductor device in the zero logic state according to the present invention.
Figure 5:
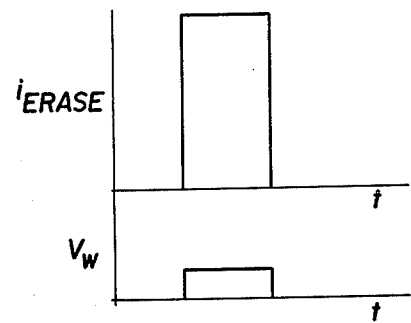
FIG. 5 is a graph of the current and voltage for the erase pulse.

The second logic state may be erased by applying an erase pulse whose current and voltage are illustrated in FIG. 5. It should be noted that although the write voltage is selected as the erase voltage, the erase current must be substantially greater than the write current. By using substantially small cross-section or diameter amorphous devices, the erase pulse of FIG. 5 causes the hot channel to expand to the extremities of the aperture device as illustrated in FIG. 4a. This expansion of the hot filament prevents additional crystallite growth in the amorphous element and thus produces the zero logic state illustrated in FIG. 4b.

Although the substantially no crystalline state of FIG. 4b is considered the zero logic state and the microcrystalline state of FIG. 2c is considered the one logic state, these may be reversed such that the write pulse of FIG. 3 becomes the erase pulse and the erase pulse of FIG. 5 becomes the write pulse.

For the amorphous semiconductor element illustrated in FIGS. 2 and 4 made of a Germanimun Telluride alloy having for example a thickness of 5,000 Å and a diameter of 3-5 microns, the write pulse of less than one microsecond and the erase pulse of approximately one microsecond are sufficient. The write-erase voltage $V_w$ will be 0.4 volts and the write current $i_r$ of 1-5 milliamps and erase current $i_e$ of 50 milliamps would result. It should be noted that the possibility does exist to use an erase pulse of a greater voltage amplitude than the write pulse but of a shorter duration so as to effectively erase the logic one state without the necessity of expanding the filament to the extremities of the device aperture.

The characteristic of the amorphous semiconductor device of FIGS. 2 and 4 are illustrated in FIG. 6. The threshold switching voltage for the zero logic state and the one logic state are illustrated in FIG. 6 for a fixed pulse. Curves illustrating the threshold voltage of the zero logic state as a function of time and the one logic state as a function of time are illustrated in FIG. 7. For the time $t_m$, the threshold or switching voltage for the logic states $V_0$ and $V_1$ are illustrated. These may be, for example, for a $t_m$ of 100 nanoseconds having a voltage $V_0$ equal to 4.5 volts and $V_1$ equal to 3 volts.

A read voltage $V_r$ is selected between the threshold voltage $V_1$ for the logic state one and the threshold voltage $V_0$ for the zero logic state. The time at which the logic one state device of FIG. 2c would conduct is $t_{r1}$ and the time at which the logic zero state device illustrated in FIG. 4b would conduct is $t_{r0}$. Thus, if a read pulse having an amplitude of $V_r$ and a duration of $(t_{r0}+t_{r1})/2$ is applied to the device, the device in the logic one state having a threshold voltage of $V_1$ would conduct and a device in the logic zero state having a threshold voltage of $V_0$ would not conduct.

Figure 8:
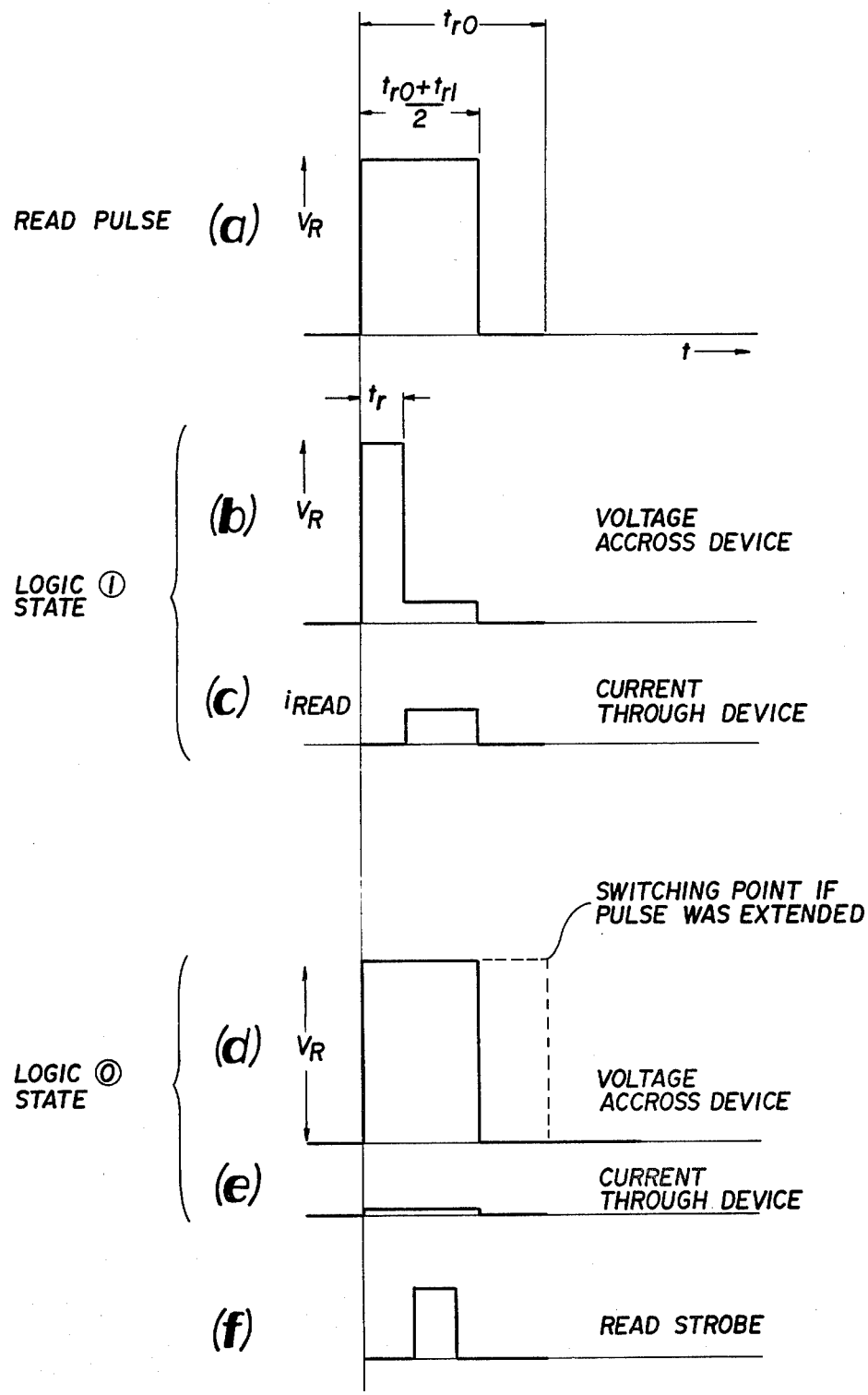
FIGS. 8a-f are graphs illustrating the read technique of the present invention.

The mechanics and operation of the read technique is illustrated in FIG. 8. The read pulse is illustrated in FIG. 8a as an amplitude of $V_r$ and a duration of $(t_{r0}+t_{r1})/2$. The voltage across and the current through the logic one state device of FIG. 2c is illustrated in FIGS. 8b&c. Up to the time $t_{r1}$, the voltage across the device is the read voltage $V_r$ and there is no read current. Upon reaching the threshold voltage $V_1$ for the logic one state device, the voltage across the device diminishes and a current is transmitted through the device. For the logic zero state device, as illustrated in FIGS. 8d&e, voltage across the device remains at the referenced voltage $V_r$ and the current through the device is negligible. Since the duration of the read voltage $V_r$ is shorter than the time $t_{r0}$ required to reach the threshold voltage of the switching point for the logic zero state device, the voltage across and the current through a zero logic state device remain at $V_r$ and zero, respectively.

A read strobe pulse is illustrated in FIG. 8f whereby the characteristics; namely the current or the voltage, of the amorphous semiconductor device is monitored to determine whether it is in the logic one or logic zero state. The read strobe occurs at a time greater than $t_{r1}$, which is the time for the first logic state to switch at the read voltage $V_r$, so as to detect this change and distinguish it from the non-conductor characteristics for the zero logic state device. The time frame for the read cycle may vary from one nanosecond to many microseconds. Similarly, it is advantageous to keep the total energy of the read pulse as small as possible to avoid any disruptive effects.

An example of voltages and times for the amorphous semiconductor device previously described are $V_r=4$ volts, $V_0=4.5$ volts, $V_1=3$ volts, $t_{r1}=50$ nanoseconds, and $t_{r0}=500$ nanoseconds.

From the preceding description of the preferred embodiments, it is evident that the objects of the invention are obtained and that an amorphous semiconductor memory cell is provided which is considered a fast read/write RAM.

Although the invention has been described and illustrated in detail, it is to be clearly understood that the same is by way of illustration and example only and is not to be taken by way of limitation. The spirit and scope of this present invention being limited only by the terms of the appended claims.

What is claimed:

1. In an amorphous memory device having a first logic state represented by a high resistance state and a first threshold voltage level for electrical conduction, the method of storing a second logic state in said device comprising applying a voltage across the device sufficient to cause conduction and crystal growth and terminating said voltage before sufficient crystal growth occurs to create a low resistance state in said device whereby said second logic state is represented by a high resistance state and a second threshold voltage level for electrical conduction lower than said first threshold voltage level.

2. The method of claim 1 wherein said voltage is applied for less than one microsecond.

3. The method of claim 1 including erasing said second logic state comprising applying a current through said device of a sufficient amplitude to create a hot conducting channel which expands to the lateral edges of the amorphous element.

4. The method of claim 3 wherein said current is applied for approximately one microsecond.

5. A method of reading a memory element having at least a first and second logic state, represented by a first and second threshold voltage level for conduction, respectively, wherein each logic state has a high resistance state comprising:
applying a read voltage pulse across said element for a duration greater than the duration for element switching and conduction of said second logic state at said read voltage and less than the duration for element switching and conduction of said first logic state at said read voltage; and
monitoring an electrical characteristic of said element during said read voltage pulse at a time greater than the duration for element switching and conduction of said second logic state.

6. The method according to claim 5 wherein the voltage across the element is monitored.

7. The method according to claim 5 wherein the current through the element is monitored.

8. The method according to claim 7 wherein said read voltage duration is selected to be at least as long as the average of said first and second state durations.

9. An amorphous memory having at least two cells comprising:
a first cell having electrode means for applying read and write voltages across the cell and amorphous material between said electrode means in a first logic state represented by a high resistance state and a first threshold voltage level for conduction; and
a second cell having electrode means for applying read and write voltages across the cell and amorphous material between said electrode means in a second logic state represented by a high resistance state and a second threshold voltage level for conduction lower than said first threshold voltage level;
the dimensions of the amorphous material of the cells are sufficiently small to enable both logic states to be altered in the range of microseconds.

10. The amorphous memory of claim 9 wherein said first cell has substantially no crystal structure and said second cell has microcrystal structure insufficient to create a low resistance state.

11. A fast write non-volatile RAM comprising:
a first cell of amorphous material in a first logic state represented by a first threshold voltage level for conduction, and substantially no crystal structure, and electrode means for applying read and write voltages across the amorphous material; and
a second cell of amorphous material in a second logic state represented by a second threshold voltage level for conduction less than said first threshold voltage level and microcrystal structure insufficient to create a resistance state of an order of magnitude different than the resistance state of said first cell, and electrode means for applying read and write voltages across the amorphous material;
the dimensions of the amorphous material of the cell are sufficiently small to enable both logic states to be altered in the range of microseconds.

12. The non-volatile RAM of claim 11 wherein said amorphous material is an amorphous semiconductor material.

13. The non-volatile RAM according to claim 11 wherein the cross-sectional area of said cells is sufficiently small so as to change a cell in a second logic state to a cell in a first logic state by applying a voltage equivalent to a write voltage for approximately one microsecond.

* * * * *